(12) United States Patent
Conte et al.

(10) Patent No.: US 6,288,960 B1
(45) Date of Patent: Sep. 11, 2001

(54) BIAS CIRCUIT FOR READ AMPLIFIER CIRCUITS FOR MEMORIES

(75) Inventors: Antonino Conte, Tremestieri Etneo; Maurizio Gaibotti, Cesano Maderno; Tommaso Zerilli, Tremestieri Etneo, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/686,326

(22) Filed: Oct. 11, 2000

(30) Foreign Application Priority Data

Oct. 14, 1999 (IT) .............................................. MI99A2149

(51) Int. Cl.[7] ..................................................... G11C 7/00

(52) U.S. Cl. ...................... 365/205; 365/189.09; 327/53

(58) Field of Search .............................. 365/205, 189.09, 365/207; 327/53

(56) References Cited

U.S. PATENT DOCUMENTS 5,929,658 * 7/1999 Cheung et al. .......................... 327/53
6,115,316 * 9/2000 Mori et al. ....................... 365/205 X

* cited by examiner

*Primary Examiner*—Huan Hoang
(74) *Attorney, Agent, or Firm*—Theodore E. Galanthay; Allen, Dyer, Doppelt, Milbrath & Gilchrist, P.A.

(57) ABSTRACT

A bias circuit for read amplifier circuits for memories includes at least one first circuit branch formed by a first pair of MOS transistors connected between a supply voltage and ground. The first pair of MOS transistors includes a P-channel diode connected transistor and an N-channel transistor connected in series, with an enable transistor interposed therebetween. The first circuit branch drives a capacitive load for coupling to the supply voltage. The bias circuit further includes reference current amplifier circuit branches for amplifying a reference current which flows in the first circuit branch for charging the capacitive load. A circuit portion, which controls the charging current of the capacitive load, includes a feedback loop between the reference current amplifier circuit branches and the capacitive load.

47 Claims, 1 Drawing Sheet

US 6,288,960 B1

BIAS CIRCUIT FOR READ AMPLIFIER CIRCUITS FOR MEMORIES

FIELD OF THE INVENTION

The present invention relates to a bias circuit for read amplifier circuits for memories, and, more particularly, the memory is of the EEPROM type, which is capable of operating over a wide supply voltage range, such as 1.8–3.6 V, for example.

BACKGROUND OF THE INVENTION

When supply voltages on the order of 1.8 V are to be attained, the use of inverting amplifiers with an active load becomes necessary. These inverting amplifiers require a circuit capable of providing the appropriate bias voltage. Moreover, active load inverters have the advantage of allowing a high voltage and a temperature controlled biasing of the memory bit line if the dimensions of the transistor used as the inverter are appropriately chosen.

The bias circuit, however, requires a very large capacitor for coupling to the power supply for noise rejection. The circuit must therefore be able to drive large capacitive loads and must be allowed to reach a steady-state current value without current overshooting. This might cause malfunctions during the first reading of the memory after its power-on.

The circuit must also be able to power on in a very short time so that it is possible to switch off all the circuits related to the sense amplifier. This minimizes power consumption without penalizing the speed with which the first reading of the memory occurs.

Conventional circuits capable of providing a bias voltage are usually provided by current mirror structures which start from the reference current and achieve the intended bias current by a multiplication factor. A typical conventional structure is shown in FIG. 1, which is formed by a diode connected P-channel transistor P1 and an N-channel transistor N1 is connected in series. The transistors P1 and N1 are connected between a supply voltage Vdd and ground. A capacitor C is connected between the gate terminal of the transistor P1 and the supply voltage Vdd.

If the circuit shown in FIG. 1 must drive large capacitive loads C, it can be rendered very fast if the node VIPSENSE is precharged to the ground value at the beginning of each power-on. The main drawback of the circuit of FIG. 1 is that this optimization is very difficult to provide for all kinds of processes, temperatures, models and supply voltages.

If the circuit is optimized for a supply voltage of 3 V, for example, while avoiding current overshooting, then the risk arises for making the circuit too slow at lower voltages, such as 1.8 V. The opposite is also true if the circuit is rendered fast enough for a supply voltage Vdd equal to 1.8 V, there is the risk of providing current overshooting for Vdd equal to 3 V. On the other hand, if the node VIPSENSE is made to start from a value which is close to the steady-state value, it is still necessary to place many buffers in parallel to each other to charge the capacitor C rapidly enough.

SUMMARY OF THE INVENTION

An object of the present invention is to provide a bias circuit for read amplifier circuits for memories for setting a bias voltage very rapidly and without current overshooting.

Another object of the present invention is to provide a bias circuit for read amplifier circuits for memories that operate over a wide range of supply voltages, and independently of the processes and temperatures.

A further object of the present invention is to provide a bias circuit for read amplifier circuits for memories for charging the coupling capacitor with the supply voltage in a very short time.

Yet a further object of the present invention is to provide a bias circuit for read amplifier circuits for memories having good noise rejection.

Another object of the present invention is to provide a bias circuit for read amplifier circuits for memories that is highly reliable, relatively easy to provide and at competitive costs.

These objects and others which will become more apparent hereinafter are provided by a bias circuit for read amplifier circuits for memories, comprising at least one first circuit branch formed by a first pair of MOS transistors connected between a supply voltage and ground. The first pair of MOS transistors include a P-channel diode connected transistor and an N-channel transistor with an enable transistor interposed therebetween.

The first circuit branch drives a capacitive load for coupling to the supply voltage, characterized in that it comprises reference current amplifier circuit branches for amplifying a reference current which flows in the first circuit branch and is adapted to charge the capacitive load. The bias circuit further includes a circuit portion for controlling a charging current of the capacitive load. The control circuit portion comprises a feedback loop between the reference current amplifier circuit branches and the capacitive load.

BRIEF DESCRIPTION OF THE DRAWINGS

Further characteristics and advantages of the present invention will become more apparent from the following detailed description of a preferred but not exclusive embodiment of the bias circuit according to the invention, illustrated only by way of a non-limiting example in the accompanying drawings, wherein.

DETAILED DESCRIPTION OF THE PREFERRED EMBODIMENTS

Figure 1:
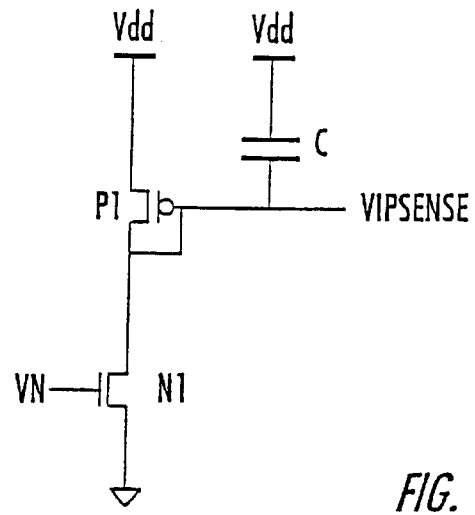
FIG. 1 is a circuit diagram of a conventional bias circuit according to the prior art.
Figure 2:
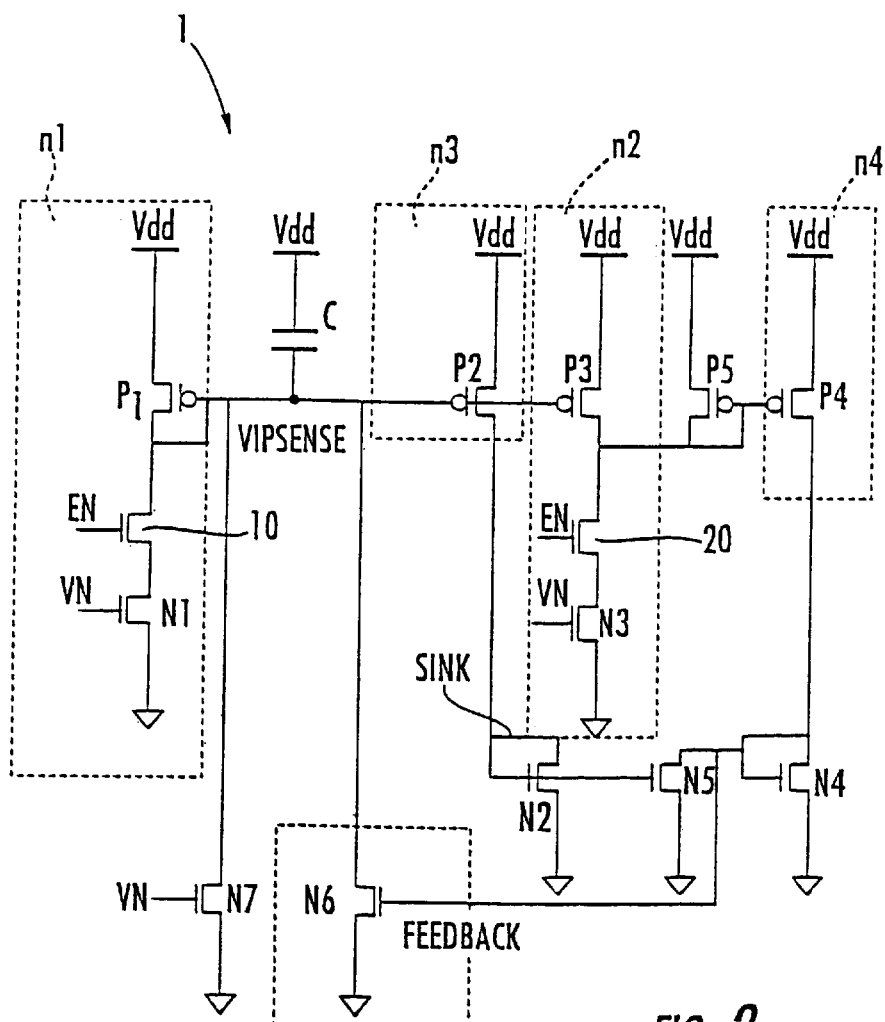
FIG. 2 is a circuit diagram of a bias circuit according to the present invention.

With reference to FIG. 2, since FIG. 1 has already been discussed, the bias circuit according to the present invention is generally designated by the reference numeral 1, and comprises a first circuit branch that is formed by two MOS transistors. One of the MOS transistors is a P-channel transistor P1 and the other one is an N-channel transistor N1. These two transistors are series connected between a supply voltage Vdd and ground. The P-channel transistor P1 is configured as a diode.

An enable transistor 10 is interposed between the P-channel transistor P1 and the N-channel transistor N1. The first circuit branch drives a capacitor C which is connected to the supply voltage Vdd. The N-channel transistor N1 is driven by a bias voltage VN, while the enable transistor 10 is driven by an enable signal EN.

The first circuit branch is actually formed by a plurality of circuit branches which are mutually identical and connected in parallel. The number of the first circuit branches can be determined according to requirements. The particularity of the invention is that current based control of the structure is provided.

For this purpose there are provided control branches, and specifically a second circuit branch which is formed by a P-channel transistor P3 and an N-channel transistor N3 which are series connected. These two transistors are also connected between the supply voltage Vdd and ground. The second circuit branch also has an enable transistor 20 driven by an enable signal EN.

The N-channel transistor N3 is driven by a bias voltage VN like the N-channel transistor N1 in the first circuit branch. The second circuit branch is actually formed by a plurality of mutually identical and parallel connected circuit branches. A third circuit branch, formed by a plurality of identical circuit branches which are parallel connected, includes a P-channel transistor P4 which is connected to the second circuit branch by interposing a diode connected P-channel transistor P5.

The transistor P4 is series connected to an N-channel transistor N4, which is connected to ground. The transistor N4 is a diode connected transistor which mirrors the current on an N-channel transistor N6 connected between the node VIPSENSE and ground. The transistor N6 is formed by a plurality of transistors N6 which are mutually identical and are parallel connected.

Finally, a fifth circuit branch, formed by a P-channel transistor P2, having a gate terminal connected to the gate terminal of the P-channel transistor P3 of the second circuit branch. The gate terminal of the P-channel transistor P2 is also connected to the node VIPSENSE. The fifth circuit branch is connected to an N-channel transistor N2 which is diode connected. The N-channel transistor N2 has a gate terminal connected to the gate terminal of an N-channel transistor N5. The N-channel transistor N5 has a collector terminal connector to the collector terminal of the N-channel transistor N4.

The first, second, third, fourth and fifth circuit branches are each formed by a plurality of similar circuit branches which are mutually parallel connected. The number of the circuit branches is chosen according to the charging speed requirements of the node VIPSENSE.

An additional N-channel transistor N7, driven by the bias voltage signal VN, is connected between the gate terminal of the P-channel transistor P1 and ground for biasing thereof. With reference to FIG. 2 the operation of the bias circuit according to the invention is as follows.

Initially, the node VIPSENSE is pre-biased with a very low current to be in a condition which is far from the steady-state voltage. This occurs when the enable signal EN is brought to Vdd and, therefore, the power-on step begins.

During the power-on step the P-channel transistor P3 is off since the node VIPSENSE is far from its final steady-state value. The current generated by the N-channel transistor N3, which is also driven by the bias signal VN, is carried in the diode connected P-channel transistor P5, is mirrored in the P-channel transistor P4, and is carried in then in the diode connected N-channel transistor N4 to the N-channel transistor N6.

Therefore, if Iref designates the current that flows through the first and second circuit branches (branches with the P-channel transistors P1 and P3) during the initial step, the current with which the capacitor C for coupling to the supply voltage Vdd is charged will be:

$$I = Iref*N1 + Iref*N2*N4*N5$$

Current I is the charging current of the capacitor C, while N1, N2, N4 and N5 are whole numbers which indicate the number of circuit branches that form each one of the first, second, third and fourth circuit branches. The current I is independent of the supply voltage, of the temperature and of the process types, and depends solely on the stability of the reference current Iref.

The charging of the capacitor C is controlled by the second circuit branch, which comprises the P-channel transistor P3. When the node VIPSENSE starts to approach the steady-state value, the P-channel transistor P3 begins to conduct and, therefore, tends to switch off the P-channel transistor P5. While in the initial step, in which VIPSENSE is high, they are off. Accordingly, the mirrored current of the P-channel and N-channel transistors P4, N4 and N6 will be lower and, therefore, the node VIPSENSE will drop rapidly.

This drop is a function of the current that is mirrored in the P-channel and N-channel transistors P4, N4 and N6 and is adjustable according to the number of P-channel transistors P3, P5 and P4 used in the control branches. However, to ensure a control which is capable of avoiding current overshooting, a second loop is used. This loop is formed by the transistors P-channel and N-channel P2, N2 and N5. When the current of the P-channel transistor P2 (which depends on the voltage on the node VIPSENSE) reaches the final value, the voltage across the FEEDBACK node will be reduced, as shown in FIG. 2.

The biasing circuit according to the invention fully achieves the intended objects, since it allows charging of the coupling capacitor C with the supply voltage in a very short time. The circuit is also able to set the bias voltage very rapidly and without current overshooting (voltage undershooting). This last requirement is essential if considerable precision in a sense amplifier that uses the circuit according to the invention is required. This is necessary if one wishes the sense amplifier to discriminate even very low current values.

The circuit according to the invention is capable of operating with the same performance over a wide supply voltage range, independent of the type of process with which the component transistors are provided, and independent of the temperature. The noise rejection that the circuit is capable of offering is provided by the capacitor that allows coupling of the bias node to the supply voltage having a high value and is charged in a short time.

The circuit can easily be optimized by acting on the parameters of the N-channel N2, N3, N4 and N5 which determine the number of the component circuit branches to optimize the speed and stability of the circuit. The circuit according to the invention is particularly adapted to obtain a bias voltage for current mirrors used in a sense amplifier as active loads for inverting stages.

The circuit according to the present invention is susceptible to numerous modifications and variations, all of which are within the scope of the invention. All the details may furthermore be replaced with other technically equivalent elements. The disclosure of Italian Patent Application No. MI99A002149, from which this application claims priority, is incorporated herein by reference in its entirety, and is assigned to the assignee of the present invention.

That which is claimed is:

1. A bias circuit for a sense amplifier circuit for a memory comprising:
   a capacitive load connected to a first voltage reference;
   at least one first circuit branch connected to said capacitive load for driving said capacitive load with a reference current so that said capacitive load is charged to the first voltage reference, said at least one first circuit branch comprising
      a pair of MOS transistors connected between the first voltage reference and a second voltage reference, said first pair of MOS transistors comprising a first branch P-channel MOS transistor configured as a diode and a first branch N-channel MOS transistor connected in series therewith, and a first branch enable N-channel MOS transistor connected between said first branch P-channel MOS transistor and said first branch N-channel MOS transistor;

at least one reference current amplifier branch for amplifying the reference current in said at least one first circuit branch; and a control circuit comprising a feedback loop connected between said at least one reference current amplifier branch and said capacitive load for controlling charging of said capacitive load.

2. A bias circuit according to claim 1, further comprising a bias transistor connected between a gate of said first branch P-channel MOS transistor and the second voltage reference.

3. A bias circuit according to claim 1, wherein said at least one reference current amplifier branch comprises:

at least one second circuit branch comprising a pair of MOS transistors comprising a second branch P-channel MOS transistor and a second branch N-channel MOS transistor connected in series therewith, said second branch P-channel MOS transistor comprising a gate connected to a gate said first branch P-channel MOS transistor; and a P-channel MOS transistor configured as a diode and connected to said at least one second circuit branch.

4. A bias circuit according to claim 3, wherein said at least one second circuit branch comprises a second branch enable N-channel MOS transistor connected between said second branch P-channel MOS transistor and said second branch N-channel MOS transistor.

5. A bias circuit according to claim 3, wherein a bias voltage signal is applied to a gate of said first branch P-channel MOS transistor and to the gate of said second branch P-channel MOS transistor.

6. A bias circuit according to claim 3, wherein said at least one reference current amplifier branch further comprises at least one third circuit branch comprising a mirroring P-channel MOS transistor comprising a gate connected to a gate of said P-channel MOS transistor configured as a diode; and an additional mirroring N-channel MOS transistor configured as a diode and connected in series with said mirroring P-channel MOS transistor.

7. A bias circuit according to claim 6, wherein said at least one reference current amplifier branch further comprises at least one fourth circuit branch connected between said additional mirroring N-channel MOS transistor and said capacitive load.

8. A bias circuit according to claim 7, wherein said feedback loop comprises at least one fifth circuit branch comprising:

a fifth branch P-channel MOS transistor comprising a gate connected to said capacitive load and to the gate of said second branch P-channel MOS transistor; and a fifth branch N-channel MOS transistor configured as a diode and connected in series with said fifth branch P-channel MOS transistor, said fifth branch N-channel MOS transistor connected between the gate of said fifth branch P-channel MOS transistor and a gate of said additional mirroring N-channel MOS transistor.

9. A bias circuit according to claim 8, wherein said at least one second, third and fifth circuit branches are each connected between the first voltage reference and the second voltage reference.

10. A bias circuit according to claim 8, wherein said at least one first, second, third, fourth and fifth circuit branches each comprises a plurality of respective circuit branches, and wherein a number of the plurality of respective circuit branches is based upon speed and stability characteristics of the bias circuit.

11. A bias circuit for a sense amplifier circuit for a memory comprising:

a capacitive load connected to a first voltage reference;

at least one first circuit branch connected to said capacitive load for driving said capacitive load with a reference current so that said capacitive load is charged to the first voltage reference, said at least one first circuit branch comprising a pair of transistors connected between the first voltage reference and a second voltage reference;

at least one reference current amplifier branch for amplifying the reference current in said at least one first circuit branch; and a control circuit connected between said at least one reference current amplifier branch and said capacitive load for controlling charging of said capacitive load.

12. A bias circuit according to claim 11, wherein said pair of transistors comprises a first branch transistor of a first conductivity type configured as a diode and a first branch transistor of a second conductivity type connected in series therewith.

13. A bias circuit according to claim 12, wherein said at least one first circuit branch further comprises a first branch enable transistor of the second conductivity type connected between said first branch transistor of the first conductivity type and said first branch transistor of the second conductivity type.

14. A bias circuit according to claim 12, further comprising a bias transistor connected between a control terminal of said first branch transistor of the first conductivity type and the second voltage reference.

15. A bias circuit according to claim 12, wherein a bias voltage signal is applied to a control terminal of said first branch transistor of the first conductivity type and to the control terminal of said second branch transistor of the first conductivity type.

16. A bias circuit according to claim 12, wherein said first branch transistor of the first conductivity type comprises a P-channel MOS transistor and said first branch transistor of the second conductivity type comprises an N-channel MOS transistor.

17. A bias circuit according to claim 12, wherein said at least one reference current amplifier branch comprises:

at least one second circuit branch comprising a pair of transistors comprising a second branch transistor of the first conductivity type and a second branch transistor of the second conductivity type connected in series therewith, said second branch transistor of the second conductivity type comprising a control terminal connected to a control terminal of said first branch transistor of the first conductivity type; and a first transistor of the first conductivity type configured as a diode and being connected to said at least one second circuit branch.

18. A bias circuit according to claim 17, wherein said at least one second circuit branch comprises a second branch enable transistor of the second conductivity type connected between said second branch transistor of the first conductivity type and said second branch transistor of the second conductivity type.

19. A bias circuit according to claim 17, wherein said at least one reference current amplifier branch further comprises at least one third circuit branch comprising:
   a mirroring transistor of the first conductivity type comprising a control terminal connected to a control terminal of said first transistor of the first conductivity type configured as a diode; and
   an additional mirroring transistor of the second conductivity type configured as a diode and connected in series with said mirroring transistor.

20. A bias circuit according to claim 19, wherein said at least one reference current amplifier branch further comprises at least one fourth circuit branch connected between said additional mirroring transistor and said capacitive load.

21. A bias circuit according to claim 17, wherein said control circuit comprises at least one fifth circuit branch defining a feedback loop, said at least one fifth circuit branch comprising:
   a fifth branch transistor of the first conductivity type comprising a control terminal connected to said capacitive load and to the control terminal of said second branch transistor of the first conductivity type; and
   a fifth branch transistor of the second conductivity type configured as a diode and connected in series with said fifth branch transistor of the first conductivity type, said fifth branch transistor of the second conductivity type being connected between the control terminal of said fifth branch transistor of the first conductivity type and a control terminal of said additional mirroring transistor of the second conductivity type.

22. A bias circuit according to claim 21, wherein said at least one second, third and fifth circuit branches are each connected between the first voltage reference and the second voltage reference.

23. A bias circuit according to claim 24, wherein said at least one first, second, third, fourth and fifth circuit branches each comprises a plurality of respective circuit branches, and wherein a number of the plurality of respective circuit branches is based upon speed and stability characteristics of the bias circuit.

24. A memory device comprising:
   at least one read circuit; and
   at least one bias circuit connected to said at least one read circuit for biasing thereof, and comprising
      a capacitive load connected to a first voltage reference,
      at least one first circuit branch connected to said capacitive load for driving said capacitive load with a reference current so that said capacitive load is charged to the first voltage reference, said at least one first circuit branch comprising a pair of transistors connected between the first voltage reference and a second voltage reference,
      at least one reference current amplifier branch for amplifying the reference current in said at least one first circuit branch, and
      a control circuit connected between said at least one reference current amplifier branch and said capacitive load for controlling charging of said capacitive load.

25. A memory device according to claim 24, wherein said pair of transistors comprises a first branch transistor of a first conductivity type configured as a diode and a first branch transistor of a second conductivity type connected in series therewith.

26. A memory device according to claim 25, wherein said at least one first circuit branch further comprises a first branch enable transistor of the second conductivity type connected between said first branch transistor of the first conductivity type and said first branch transistor of the second conductivity type.

27. A memory device according to claim 25, wherein a bias voltage signal is applied to a control terminal of said first branch transistor of the first conductivity type and to the control terminal of said second branch transistor of the first conductivity type.

28. A memory device according to claim 25, further comprising a bias transistor connected between a control terminal of said first branch transistor of the first conductivity type and the second voltage reference.

29. A memory device according to claim 25, wherein said first branch transistor of the first conductivity type comprises a P-channel MOS transistor and said first branch transistor of the second conductivity type comprises an N-channel MOS transistor.

30. A memory device according to claim 25, wherein the memory device is a EEPROM.

31. A memory device according to claim 25, wherein said at least one reference current amplifier branch comprises:
   at least one second circuit branch comprising a pair of transistors comprising a second branch transistor of the first conductivity type and a second branch transistor of the second conductivity type connected in series therewith, said second branch transistor of the second conductivity type comprising a control terminal connected to a control terminal of said first branch transistor of the first conductivity type; and
   a first transistor of the first conductivity type configured as a diode and being connected to said at least one second circuit branch.

32. A memory device according to claim 31, wherein said at least one second circuit branch comprises a second branch enable transistor of the second conductivity type connected between said second branch transistor of the first conductivity type and said second branch transistor of the second conductivity type.

33. A memory device according to claim 31, wherein said at least one reference current amplifier branch further comprises at least one third circuit branch comprising:
   a mirroring transistor of the first conductivity type comprising a control terminal connected to a control terminal of said first transistor of the first conductivity type configured as a diode; and
   an additional mirroring transistor of the second conductivity type configured as a diode and connected in series with said mirroring transistor.

34. A memory device according to claim 33, wherein said at least one reference current amplifier branch further comprises at least one fourth circuit branch connected between said additional mirroring transistor and said capacitive load.

35. A memory device according to claim 31, wherein said control circuit comprises at least one fifth circuit branch defining a feedback loop, said at least one fifth circuit branch comprising:
   a fifth branch transistor of the first conductivity type comprising a control terminal connected to said capacitive load and to the control terminal of said second branch transistor of the first conductivity type; and
   a fifth branch transistor of the second conductivity type configured as a diode and connected in series with said fifth branch transistor of the first conductivity type, said fifth branch transistor of the second conductivity type being connected between the control terminal of said fifth branch transistor of the first conductivity type and a control terminal of said additional mirroring transistor of the second conductivity type.

36. A memory device according to claim 35, wherein said at least one second, third and fifth circuit branches are each connected between the first voltage reference and the second voltage reference.

37. A memory device according to claim 35, wherein said at least one first, second, third, fourth and fifth circuit branches each comprises a plurality of respective circuit branches, and wherein a number of the plurality of respective circuit branches is based upon speed and stability characteristics of the bias circuit.

38. A method for biasing a sense amplifier circuit for a memory comprising:

charging a capacitive load to a first voltage reference with a reference current using at least one first branch circuit comprising a pair of transistors connected between the first voltage reference and a second voltage reference;

amplifying the reference current in the at least one first circuit branch using at least one reference current amplifier branch; and controlling charging of the capacitive load using a control circuit connected between the at least one reference current amplifier branch and the capacitive load.

39. A method according to claim 38, wherein the pair of transistors comprises a first branch transistor of a first conductivity type configured as a diode and a first branch transistor of a second conductivity type connected in series therewith.

40. A method according to claim 39, further comprising enabling the at least one first circuit branch using a first branch enable transistor of the second conductivity type connected between the first branch transistor of the first conductivity type and the first branch transistor of the second conductivity type.

41. A method according to claim 39, further comprising applying a bias signal to a control terminal of the first branch transistor of the first conductivity type and to the control terminal of the second branch transistor of the first conductivity type.

42. A method according to claim 39, wherein the first branch transistor of the first conductivity type comprises a P-channel MOS transistor and the first branch transistor of the second conductivity type comprises an N-channel MOS transistor.

43. A method according to claim 39, wherein the at least one reference current amplifier branch comprises:

at least one second circuit branch comprising a pair of transistors comprising a second branch transistor of the first conductivity type and a second branch transistor of the second conductivity type connected in series therewith, the second branch transistor of the second conductivity type comprising a control terminal connected to a control terminal of the first branch transistor of the first conductivity type; and a first transistor of the first conductivity type configured as a diode and being connected to the at least one second circuit branch.

44. A method according to claim 43, wherein the control circuit comprises at least one fifth circuit branch defining a feedback loop, the at least one fifth circuit branch comprising:

a fifth branch transistor of the first conductivity type comprising a control terminal connected to the capacitive load and to the control terminal of the second branch transistor of the first conductivity type; and a fifth branch transistor of the second conductivity type configured as a diode and connected in series with the fifth branch transistor of the first conductivity type, the fifth branch transistor of the second conductivity type being connected between the control terminal of the fifth branch transistor of the first conductivity type and a control terminal of the additional mirroring transistor of the second conductivity type.

45. A method according to claim 43, further comprising enabling the at least one second circuit branch using a second branch enable transistor of the second conductivity type connected between the second branch transistor of the first conductivity type and the second branch transistor of the second conductivity type.

46. A method according to claim 43, wherein the at least one reference current amplifier branch further comprises at least one third circuit branch comprising:

a mirroring transistor of the first conductivity type comprising a control terminal connected to a control terminal of the first transistor of the first conductivity type configured as a diode; and an additional mirroring transistor of the second conductivity type configured as a diode and connected in series with the mirroring transistor.

47. A method according to claim 46, wherein the at least one reference current amplifier branch further comprises at least one fourth circuit branch connected between the additional mirroring transistor and the capacitive load.

* * * * *

UNITED STATES PATENT AND TRADEMARK OFFICE
CERTIFICATE OF CORRECTION

PATENT NO. : 6,288,960 B1
DATED : September 11, 2001
INVENTOR(S) : Antonio Conte, Maurizio Gaibotti and Tommaso Zerilli Page 1 of 1

It is certified that error appears in the above-identified patent and that said Letters Patent is hereby corrected as shown below:

Column 3,
Line 32, delete "terminal connector to" insert -- terminal connected to --
Line 53, delete "is carried in then in the" insert -- is carried in the --

Column 7,
Line 38, delete "claim 24" insert -- claim 21 --

Signed and Sealed this

Twenty-eighth Day of May, 2002

Attest:

JAMES E. ROGAN
Attesting Officer
Director of the United States Patent and Trademark Office